United States Patent
Lee et al.

(10) Patent No.: US 8,927,355 B2
(45) Date of Patent: Jan. 6, 2015

(54) METHOD OF MANUFACTURING SEMICONDUCTOR DEVICES

(75) Inventors: Doo-Young Lee, Seoul (KR); Ki Il Kim, Yongin-si (KR); Myeong-Cheol Kim, Suwon-si (KR); Do-Hyoung Kim, Hwaseong-si (KR); Do-Hsing Lee, Hwaseong-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 469 days.

(21) Appl. No.: 13/304,936

(22) Filed: Nov. 28, 2011

(65) Prior Publication Data

US 2012/0135577 A1    May 31, 2012

(30) Foreign Application Priority Data

Nov. 29, 2010   (KR) .................. 10-2010-0119332

(51) Int. Cl.
| | | |
|---|---|---|
| H01L 21/339 | (2006.01) | |
| H01L 21/768 | (2006.01) | |
| H01L 29/78 | (2006.01) | |
| H01L 29/66 | (2006.01) | |

(52) U.S. Cl.
CPC .......... *H01L 29/78* (2013.01); *H01L 21/76832* (2013.01); *H01L 21/76897* (2013.01); *H01L 21/76829* (2013.01); *H01L 21/76895* (2013.01); *H01L 29/66545* (2013.01)
USPC ............................ 438/183; 438/299; 438/586

(58) Field of Classification Search
CPC .................. H01L 29/66871; H01L 29/66583; H01L 29/66545; H01L 27/3223; H01L 21/28141
USPC ......................................................... 438/183
See application file for complete search history.

(56) References Cited

U.S. PATENT DOCUMENTS

| | | | | |
|---|---|---|---|---|
| 6,429,107 | B2 * | 8/2002 | Kim et al. | 438/586 |
| 6,573,168 | B2 * | 6/2003 | Kim et al. | 438/586 |
| 2002/0045332 | A1 | 4/2002 | Jang et al. | |
| 2006/0148150 | A1 * | 7/2006 | Kavalieros et al. | 438/197 |
| 2008/0128763 | A1 * | 6/2008 | Rachmady et al. | 257/288 |
| 2008/0157365 | A1 * | 7/2008 | Ott et al. | 257/750 |

FOREIGN PATENT DOCUMENTS

| | | |
|---|---|---|
| JP | 2006-100378 | 4/2006 |
| JP | 2008-124133 | 5/2008 |
| KR | 10-2002-0029531 | 4/2002 |

* cited by examiner

*Primary Examiner* — Jarrett Stark
(74) *Attorney, Agent, or Firm* — Ellsworth IP Group PLLC (57) ABSTRACT

A method of manufacturing a semiconductor device, including the second sacrificial layer receiving a gate structure include a metal and a spacer on a sidewall of the gate structure therethrough being formed on a substrate. The second sacrificial layer is removed. A second etch stop layer and an insulating interlayer are sequentially formed on the gate structure, the spacer and the substrate. An opening passing through the insulating interlayer is formed to expose a portion of the gate structure, a portion of the spacer and a portion of the second etch stop layer on a portion of the substrate. The second etch stop layer being exposed through the opening is removed. The contact being electrically connected to the gate structure and the substrate and filling the opening is formed. The semiconductor device having the metal gate electrode and the shared contact has a desired leakage current characteristic and resistivity characteristics.

15 Claims, 10 Drawing Sheets

METHOD OF MANUFACTURING SEMICONDUCTOR DEVICES

CROSS-REFERENCE TO RELATED APPLICATIONS

This application claims priority under 35 USC §119 to Korean Patent Application No. 2010-0119332, filed on Nov. 29, 2010 in the Korean Intellectual Property Office (KIPO), the contents of which are herein incorporated by reference in their entirety.

BACKGROUND OF THE INVENTION

1. Field of the Invention

The present general inventive concept relates to methods of manufacturing semiconductor devices. More particularly, the present general inventive concept relates to methods of manufacturing semiconductor devices having a metal gate electrode and a shared contact.

2. Description of the Related Art

To minimize areas occupied by a contact of a semiconductor device, recently a method of forming a shared contact electrically connected to a gate electrode and an active region has been developed.

Furthermore, a metal gate electrode may be used to have a low resistivity and the metal gate electrode may be formed by a damascene process to overcome problems of a patterning process.

Thus, when a metal gate electrode is formed by a damascene process and when a shared contact electrically connected to the metal gate electrode and an active region is formed, an upper portion of the metal gate electrode and a spacer on a sidewall of the metal gate electrode may be damaged, so that problems of a leakage current and increased resistivity may occur.

SUMMARY OF THE INVENTION

The present general inventive concept provides a method of manufacturing a semiconductor device having a shared contact electrically connected to a metal gate electrode and an active region and having desired electrical characteristics.

Additional features and utilities of the present general inventive concept will be set forth in part in the description which follows and, in part, will be obvious from the description, or may be learned by practice of the general inventive concept.

The foregoing and/or other features and utilities of the general inventive concept may be achieved by providing a method of manufacturing a semiconductor device, including forming a second sacrificial layer on a substrate, the second sacrificial layer containing a gate structure and a spacer therethrough, the spacer being on a sidewall of the gate structure, removing the second sacrificial layer, forming a second etch stop layer and an insulating interlayer sequentially on the gate structure, the spacer and the substrate, forming an opening through the insulating interlayer to expose a portion of the second etch stop layer on portions of the gate structure, the spacer and the substrate, removing the exposed portion of the second etch stop layer to expose the portions of the gate structure, the spacer and the substrate, and forming a contact electrically connected to the gate structure and the substrate, the contact filling the opening.

The second etch stop layer may be formed using silicon nitride and the insulating interlayer is formed using silicon oxide.

The gate structure may include a gate insulation layer pattern and a gate electrode having a metal.

The exposed portion of the gate structure may be a portion of the gate electrode.

The gate insulation layer pattern may include a low-k dielectric layer pattern and a high-k dielectric layer pattern.

The low-k dielectric layer pattern may be formed on the substrate using silicon oxide. The high-k dielectric layer pattern may be formed on the low-k dielectric layer pattern using a metal oxide to surround a bottom and a sidewall of the gate electrode.

Forming the second sacrificial layer containing the gate structure and the spacer therethrough may include forming a first sacrificial layer on the substrate, the first sacrificial layer containing a dummy gate electrode and a spacer therethrough, the spacer being on a sidewall of the dummy gate electrode, removing the dummy gate electrode to form a recess, forming a gate electrode using a metal, the gate electrode filling the recess, removing the first sacrificial layer, forming a first etch stop layer and the second sacrificial layer sequentially on the gate electrode, the spacer and the substrate, and planarizing upper portions of the second sacrificial layer and the first etch stop layer using a top surface of the gate electrode as a planarization endpoint.

The dummy gate electrode may be formed using amorphous silicon or polysilicon.

Prior to forming the first sacrificial layer containing the dummy gate electrode and the spacer therethrough, forming the second sacrificial layer containing the gate structure and the spacer therethrough may further include forming a low-k dielectric layer pattern on the substrate. The spacer may be formed on sidewalls of the dummy gate electrode and the low-k dielectric layer pattern.

Forming the gate electrode may include forming a high-k dielectric layer on an inner wall of the recess and the first sacrificial layer, forming a gate electrode layer filling a remaining portion of the recess on the high-k dielectric layer, and planarizing upper portions of the gate electrode layer and the high-k dielectric layer using a top surface of the first sacrificial layer as a planarization endpoint.

The foregoing and/or other features and utilities of the general inventive concept may also be achieved by providing a method of manufacturing a semiconductor device, including forming a second sacrificial layer on a substrate having an isolation layer thereon, the second sacrificial layer containing a first gate structure, a second gate structure, a first spacer, and a second spacer therethrough, and the first and second spacers being on sidewalls of the first and second gate structures, respectively, removing the second sacrificial layer, forming a second etch stop layer and an insulating interlayer sequentially on the first and second gate structures, the first and second spacers, the isolation layer, and the substrate, forming an opening through the insulating interlayer to expose a portion of the second etch stop layer on portions of the first gate structure, the first spacer and the substrate, removing the exposed portion of the second etch stop layer to expose the portions of the first gate structure, the first spacer and the substrate, and forming a contact electrically connected to the first gate structure and the substrate, the contact filling the opening.

The first gate structure and the first spacer may be formed on the isolation layer.

The method of manufacturing the semiconductor device may further include forming an impurity region at an upper portion of the substrate adjacent to the second gate structure.

The contact may be electrically connected to the impurity region.

The second etch stop layer may be formed using silicon nitride, and the insulating interlayer is formed using silicon oxide.

The foregoing and/or other features and utilities of the general inventive concept may also be achieved by providing a method of manufacturing a semiconductor device, including doping a substrate at a first doping concentration, forming an isolation layer at an upper portion of the substrate at a second doping concentration, forming an impurity region at another upper portion of the substrate at a third doping concentration, forming a plurality of gate structures each comprising an electrode, a spacer layer, and an etch stop layer, such that at least two of the plurality of the gate structures are formed directly above the isolation layer, and forming a contact to connect the electrode of one of the at least two of the plurality of the gate structures directly to the impurity region.

The forming of the contact may further include forming an insulation interlayer on the etch stop layer, and etching a portion of the insulation interlayer into which the contact is formed such that the contact directly connects a portion of the electrode to the impurity region.

The forming of the contact may further include forming an insulation interlayer on the etch stop layer, etching a portion of the insulation interlayer above the impurity region and the one of the at least two of the plurality of the gate structures, and etching a top portion of the etch stop layer of the one of the at least two of the plurality of the gate structures such that the contact directly connects the electrode to the impurity region.

A top portion of the etch stop layer of the one of the at least two of the plurality of the gate structures may be removed to allow the contact to connect the electrode directly to the impurity region.

Side wall portions of the etch stop layer of the one of the at least two of the plurality of the gate structures may not be removed during the removal of the top portion of the etch stop layer of the one of the at least two of the plurality of the gate structures.

The isolation layer may span between a side wall edge of the spacer layer of the one of the at least two of the plurality of the gate structures and another side wall edge of the spacer layer of another of the at least two of the plurality of the gate structures.

Another of the at least one contact may be formed in another etched portion of the isolation layer to be directly in contact with the electrode of another of the at least two of the plurality of the gate structures.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present general inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present general inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present general inventive concept.

Unless otherwise defined, all terms (including technical and scientific terms) used herein have the same meaning as commonly understood by one of ordinary skill in the art to which the present general inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIGS. 1 through 12 are cross-sectional views illustrating a method of manufacturing a semiconductor device in accordance with an exemplary embodiment of the present general inventive concept.

Figure 1:
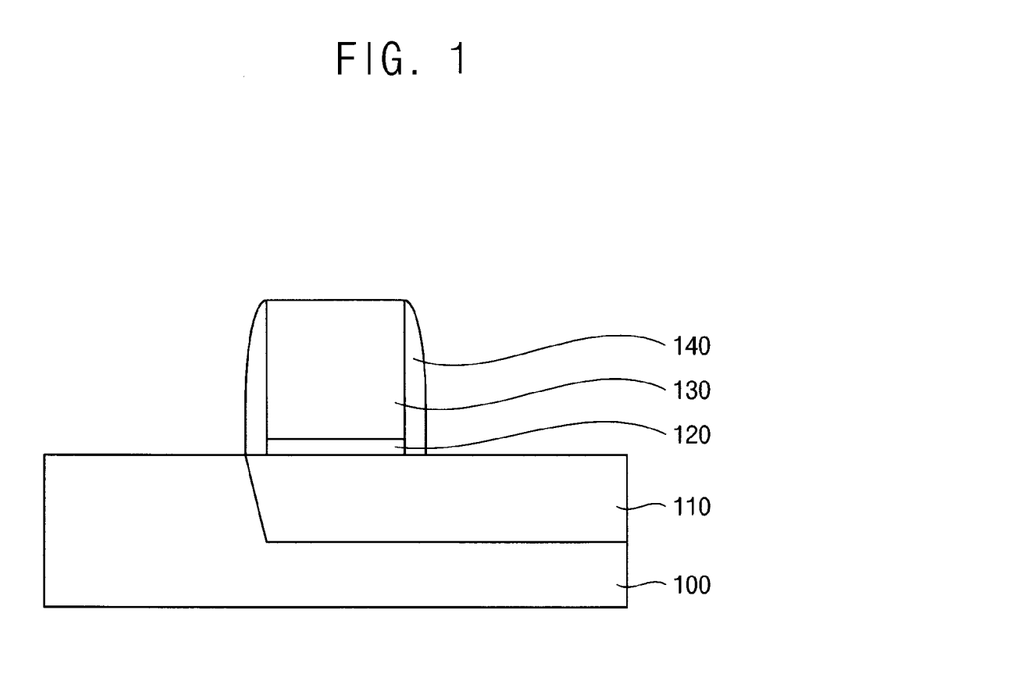
FIGS. 1 through 12 are cross-sectional views illustrating a method of manufacturing a semiconductor device in accordance with an exemplary embodiment of the present general inventive concept.

Referring to FIG. 1, a low-k dielectric layer pattern 120, a dummy gate electrode 130 and a spacer 140 may be formed on a substrate 100 having an isolation layer 110 thereon.

The substrate 100 may include a semiconductor substrate such as a silicon substrate or a germanium substrate, a silicon-on-insulator (SOI) substrate, a germanium-on-insulator (GOI) substrate, a single crystalline metal oxide substrate, but is not limited thereto. The substrate 100 may be divided into an active region and a field region. In example embodiments, the isolation layer 110 may be formed by a shallow trench isolation (STI) process.

Particularly, a low-k dielectric layer and a dummy gate electrode layer may be sequentially formed on the substrate 100 having the isolation layer 110 thereon. In example embodiments, the low-k dielectric layer may be formed by depositing silicon oxide ($SiO_2$) on the substrate 100 and the isolation layer 110 through a chemical vapor deposition (CVD) process. The dummy gate electrode layer may be formed by depositing polysilicon or amorphous silicon on the low-k dielectric layer through a CVD process.

The dummy gate electrode layer and the low-k dielectric layer may be patterned by an etching process using a hard mask (not illustrated) or a photoresist pattern (not illusrated) as an etch mask to form the low-k dielectric layer pattern 120 and the dummy gate electrode 130 sequentially stacked on the isolation layer 110. Furthermore, each of the low-k dielectric layer pattern 120 and the dummy gate electrode 130 may extend along a direction, so that portions of the low-k dielectric layer pattern 120 and the dummy gate electrode 130 may be formed directly on the substrate 100 where the isolation layer 110 is not formed, that is, on the active region of the substrate 100.

A spacer layer including silicon nitride or a silicon oxide may be formed on the isolation layer 110 and the substrate 100 to cover the dummy gate electrode 130 and the low-k dielectric layer pattern 120. The spacer layer may be patterned by an anisotropic etching process so that the spacer 140 may be formed on sidewalls of the dummy gate electrode 130 and the low-k dielectric layer pattern 120.

An ion implantation process using the dummy gate electrode 130 and the spacer 140 as an ion implantation mask may be performed to form an impurity region (not illustrated) at an upper portion of the active region of the substrate 100 that is adjacent to the dummy gate electrode 130.

Figure 2:
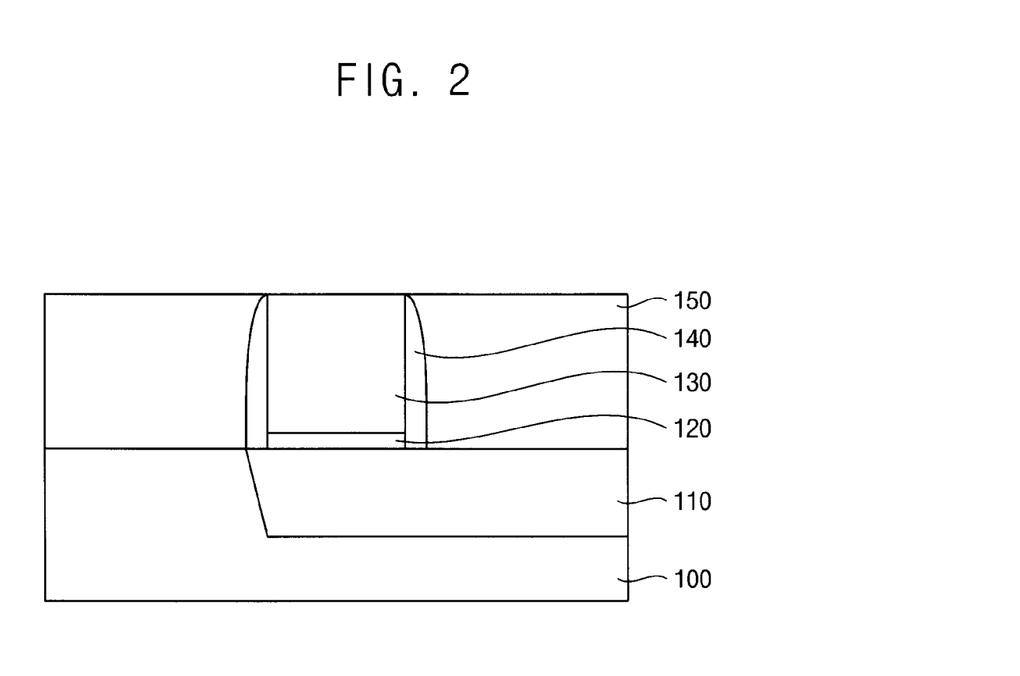

Referring to FIG. 2, a first sacrificial layer 150 may be formed on the substrate 100 and the isolation layer 110 to cover the dummy gate electrode 130 and the spacer 140. In example embodiments, the first sacrificial layer 150 may be formed using silicon oxide. An upper portion of the first sacrificial layer 150 may be planarized using a top surface of the dummy gate electrode 130 as a planarization endpoint. In example embodiments, the planarization process may be performed by a chemical mechanical polishing (CMP) process.

Figure 3:
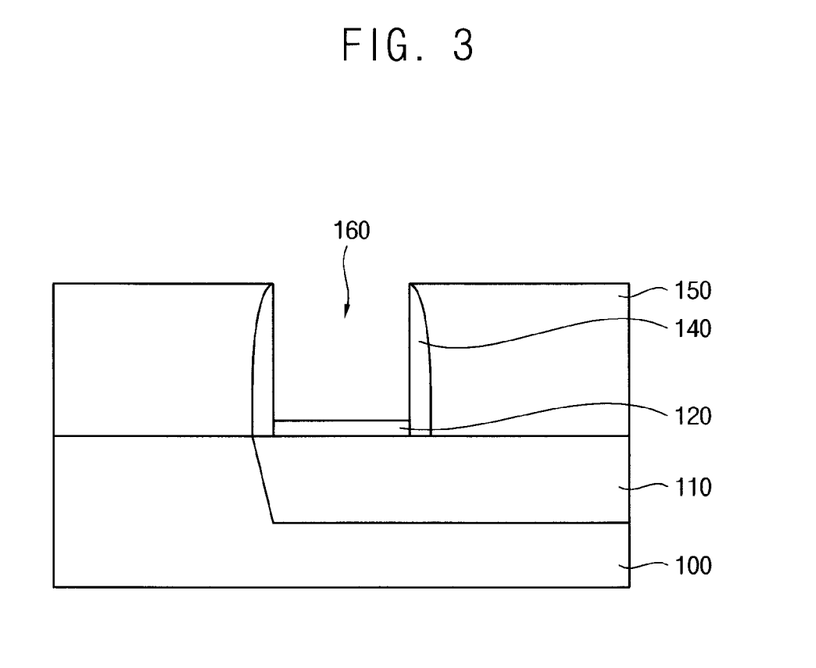

Referring to FIG. 3, an exposed portion of the dummy gate electrode 130 may be removed to form a recess 160. The dummy gate electrode 130 may be removed by a wet etching process or a dry etching process, but is not limited thereto.

Figure 4:
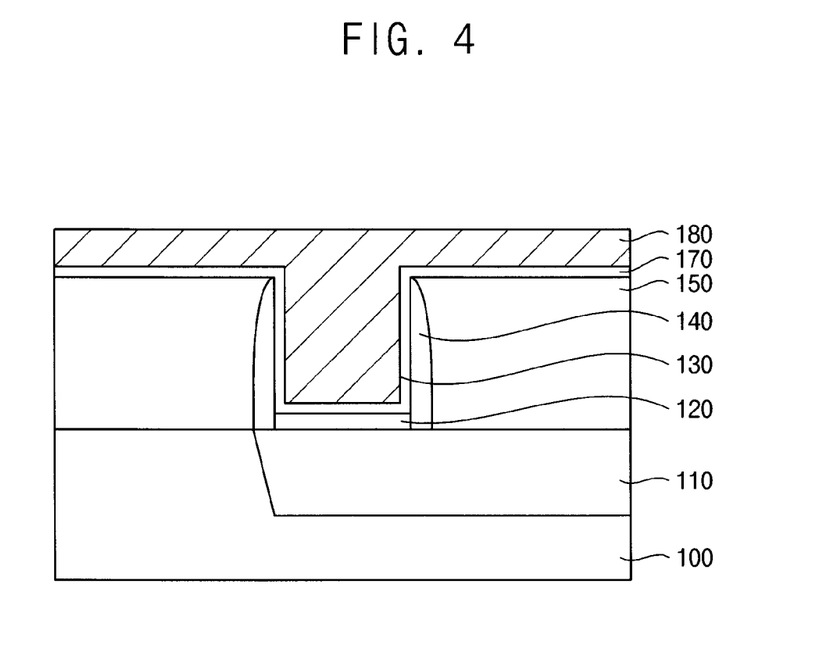

Referring to FIG. 4, a high-k dielectric layer 170 may be formed on an inner wall of the recess 160 and a top surface of the first sacrificial layer 150. The high-k dielectric layer 170 may be formed using a metal oxide. For example, the metal oxide may include hafnium oxide ($HfO_2$), tantalum oxide ($Ta_2O_5$), zirconium oxide ($ZrO_2$), but is not limited thereto.

A gate electrode layer 180 may be formed on the high-k dielectric layer 170. The gate electrode layer 180 may be formed using a metal, a metal nitride and/or a metal silicide, e.g., aluminum (Al), tungsten (W), titanium nitride (TiN) by an atomic layer deposition (ALD) process or a physical vapor deposition (PVD) process. A heat treatment process, e.g., a rapid thermal annealing (RTA) process, a spike-RTA process, a flash RTA process, a laser annealing process, etc. may be further performed on the gate electrode layer 180.

Figure 5:
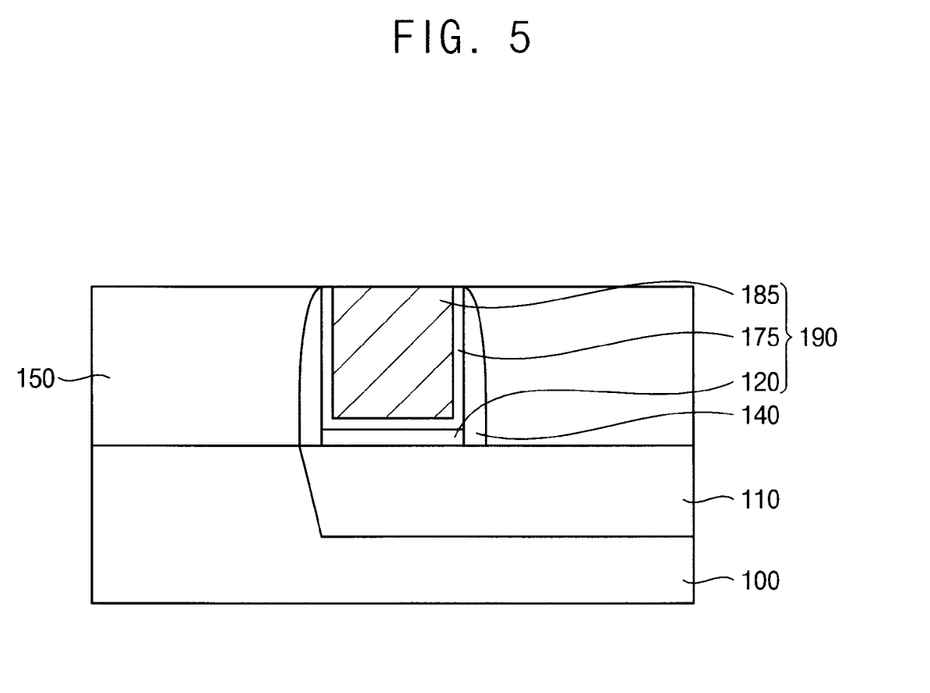

Referring to FIGS. 3 and 5, upper portions of the gate electrode layer 180 and the high-k dielectric layer 170 may be planarized using the top surface of the first sacrificial layer 150 as a planarization endpoint, so that a high-k dielectric layer pattern 175 may be formed on the inner wall of the recess 160, and a gate electrode 185 may be formed on the high-k dielectric layer pattern 175 to fill a remaining portion of the recess 160. In example embodiments, the planarization process may be performed by a CMP process.

Accordingly, a gate structure 190 including the low-k dielectric layer pattern 120, the high-k dielectric layer pattern 175, and the gate electrode 185 may be formed in the field region of the substrate 100, and the spacer 140 may be formed on a sidewall of the gate structure 190. The low-k dielectric layer pattern 120 and the high-k dielectric layer pattern 175 may serve as a gate insulation layer pattern. As described above, the gate structure 190 may be formed in the field region of the substrate 100, however, a portion of the gate structure 190 may be also formed in the active region of the substrate 100.

Figure 6:
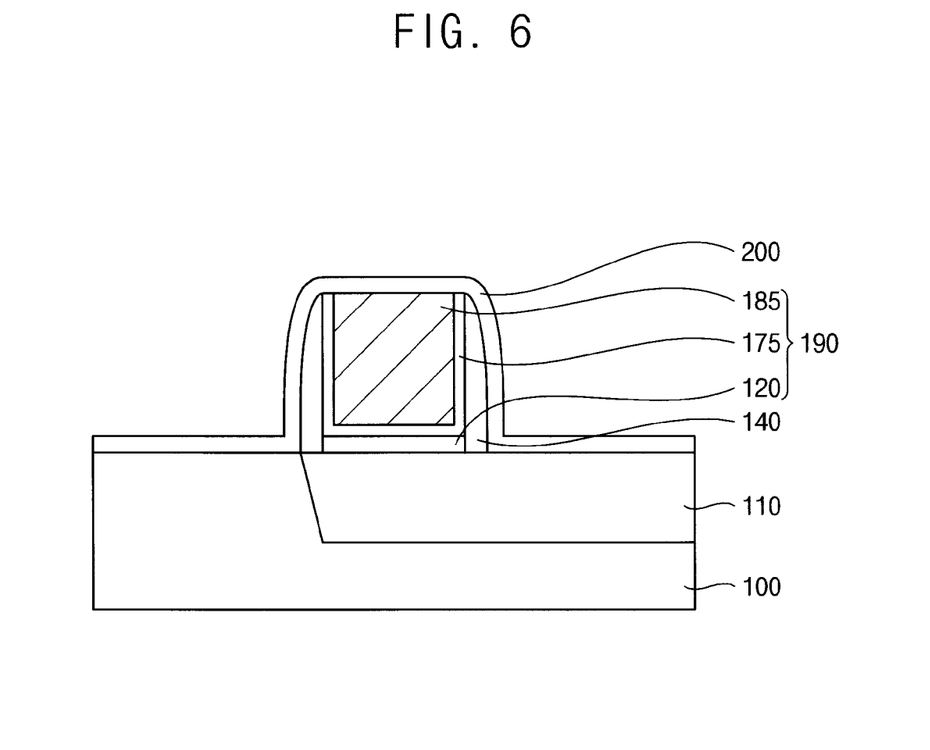

Referring to FIG. 6, the first sacrificial layer 150 may be removed, and a first etch stop layer 200 may be formed on the substrate 100 and the isolation layer 110 to cover the gate structure 190 and the spacer 140.

In example embodiments, the first etch stop layer 200 may be formed using a nitride, e.g., silicon nitride, but is not limited thereto. The first etch stop layer 200 may be formed to a thickness of about 100 Å to about 200 Å.

Figure 7:
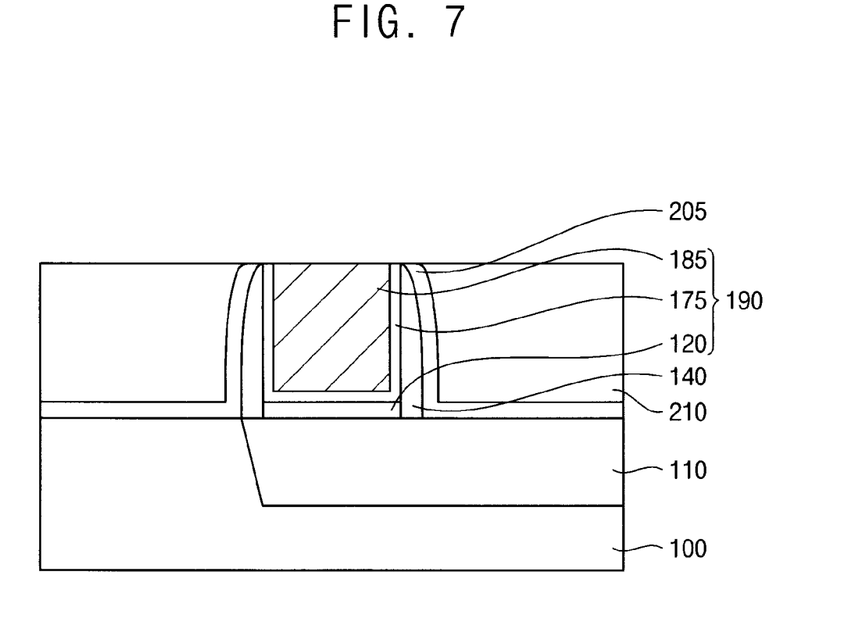

Referring to FIGS. 6 and 7, a second sacrificial layer 210 may be formed on the first etch stop layer 200. In example embodiments, the second sacrificial layer 210 may be formed using an oxide, e.g., silicon oxide, but is not limited thereto. The second sacrificial layer 210 may be formed to a thickness of about 5,000 Å to about 7,000 Å. Upper portions of the second sacrificial layer 210 and the first etch stop layer 200 may be planarized using a top surface of the first etch stop layer 200 as a planarization endpoint. Therefore, the first etch stop layer 200 may be transformed into a first etch stop layer pattern 205. In example embodiments, the planarization process may be performed by a CMP process.

Figure 8:
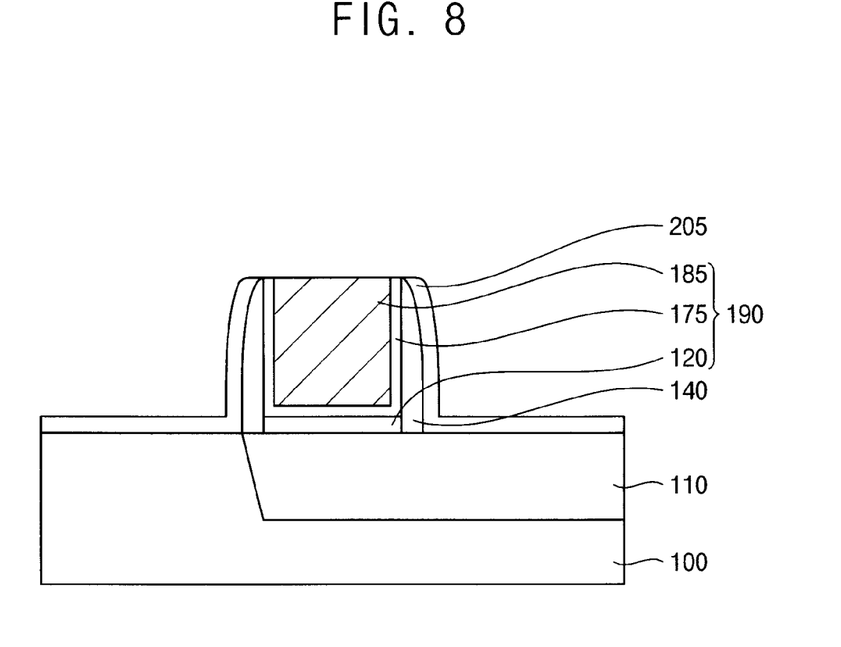

Referring to FIG. 8, the second sacrificial layer 210 may be removed. The second sacrificial layer 210 may be removed by a dry etching process or a wet etching process.

Figure 9:
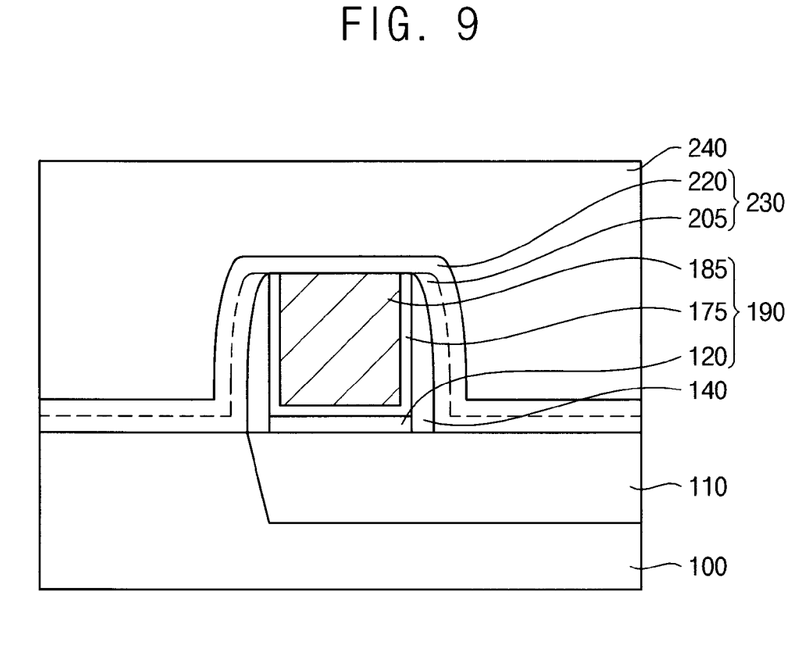

Referring to FIG. 9, a second etch stop layer 220 may be formed on the gate structure 190, the spacer 140, and the first etch stop layer pattern 205. In example embodiments, the second etch stop layer 220 may be formed using a nitride, e.g., silicon nitride, but is not limited thereto. The second etch stop layer 220 may be formed to a thickness of about 100 Å to about 200 Å.

The second etch stop layer 220 may be formed using a material substantially the same as that of the first etch stop layer pattern 205, and thus the second etch stop layer 220 and the first etch stop layer pattern 205 may be merged into a single layer, i.e., an etch stop layer structure 230.

An insulating interlayer 240 may be formed on the etch stop layer structure 230. The insulating interlayer 240 may be formed using an oxide, e.g., silicon oxide, but is not limited thereto. An upper portion of the insulating interlayer 240 may be planarized.

Figure 10:
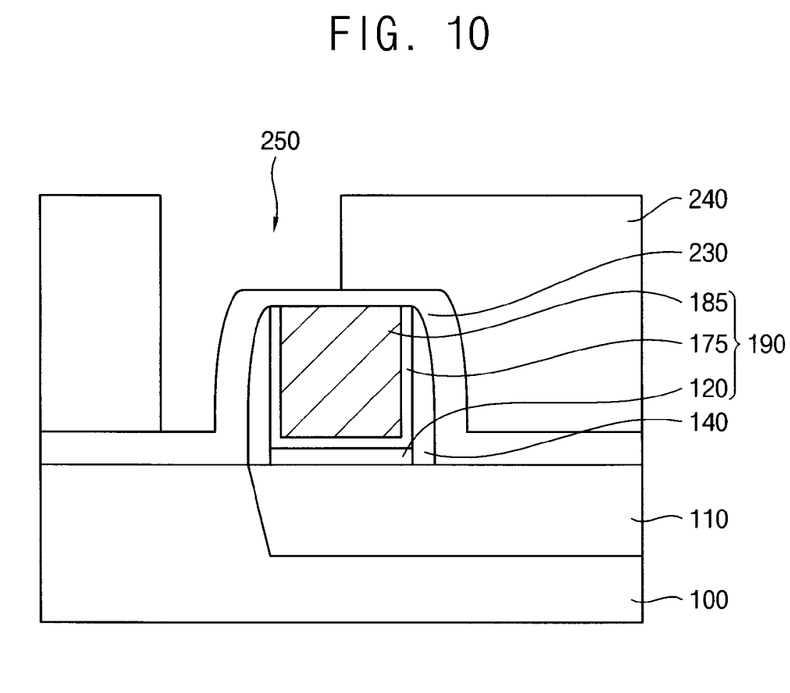

Referring to FIG. 10, a portion of the insulation interlayer 240 may be etched to form an opening 250 exposing a portion of the etch stop layer structure 230. In example embodiments, the opening 250 may be formed by a dry etching process using a photoresist pattern (not illustrated). The opening 250 may be formed through the insulating interlayer 240 to partially overlap the gate electrode 185 and the active region of the substrate 100.

When forming the opening 250, the etch rate of the insulating interlayer 240 may be different from that of the etch stop layer structure 230. Thus, the insulating interlayer 240 may be fully removed using the etch stop layer structure 230 as an etching endpoint even though the insulating interlayer 240 may have different thicknesses on the gate structure 190 and on the active region of the substrate 100.

Figure 11:
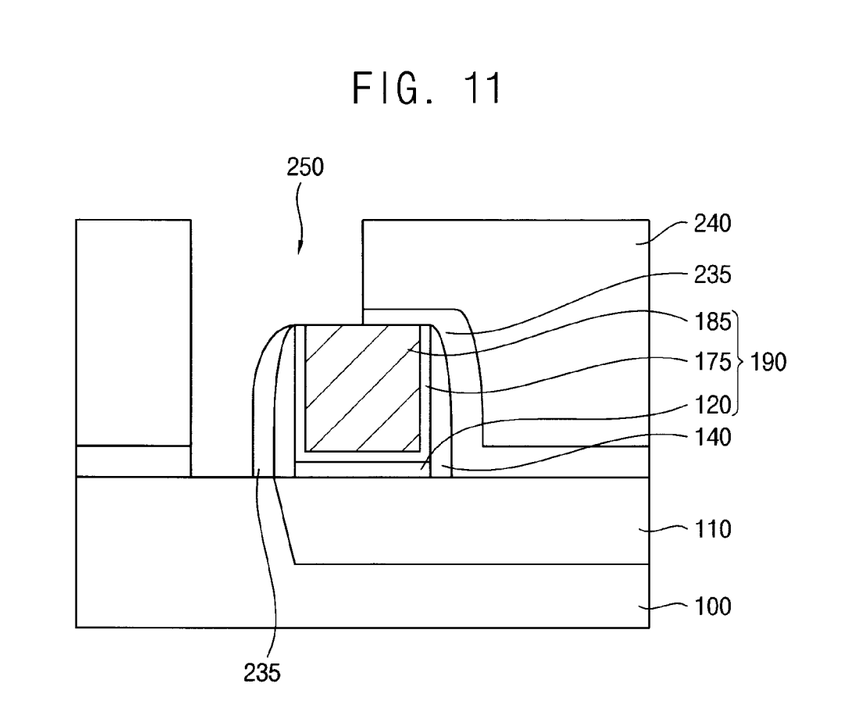

Referring to FIG. 11, the portion of the etch stop layer structure 230 exposed by the opening 250 may be removed. In example embodiments, the exposed portion of the etch stop layer structure 230 may be removed by an anisotropic etching process. Therefore, a portion of the gate electrode 185, a portion of the high-k dielectric layer pattern 175, and a portion of the active region of the substrate 100 may be exposed. A portion of the etch stop layer structure 230 may remain on a sidewall of the spacer 140, and may define an etch stop layer pattern structure 235 together with a portion of the etch stop layer structure 230 that is not exposed by the opening 250.

In the etching process, the etch stop layer structure 230 including a single material is removed, and the etch stop layer structure 230 has a thickness that is not so variant according to the position. Thus, the gate structure 190 or the spacer 140 that are beneath the etch stop layer structure 230 may not be damaged in the etching process.

Figure 12:
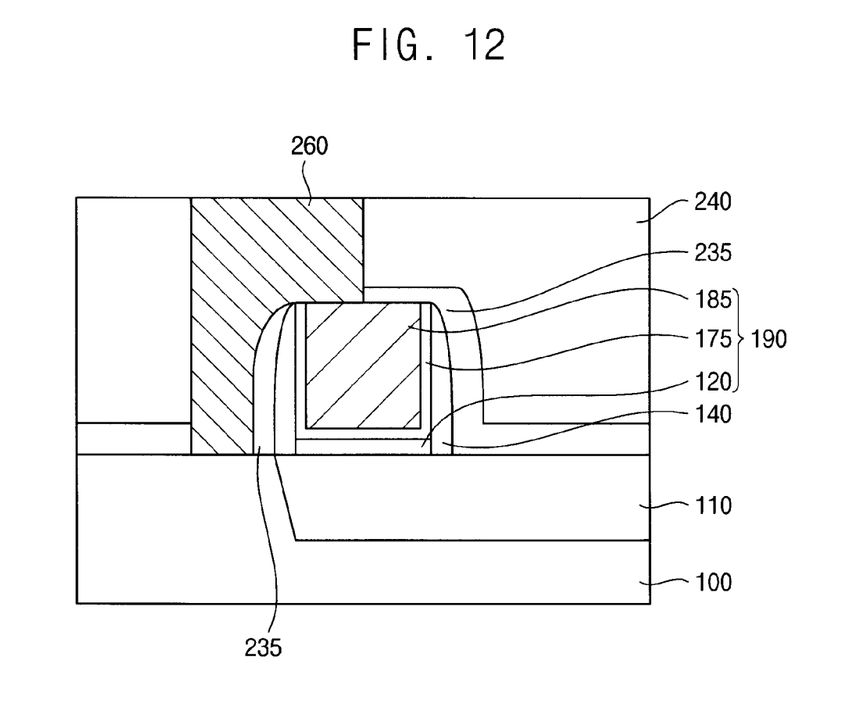

Referring to FIG. 12, a contact 260 may be formed in the opening 250.

Particularly, a conductive layer filling the opening 250 may be formed on the substrate 100, the gate structure 190 and the insulating interlayer 240, and an upper portion of the conductive layer may be planarized using a top surface of the insulating interlayer 240 as a planarization endpoint to form the contact 260.

The conductive layer may be formed using doped polysilicon, a metal, a metal nitride, and/or a metal silicide, but is not limited thereto.

The contact 260 may be formed to make contact with the active region of the substrate 100 and the gate electrode 185, so that the active region of the substrate 100 and the gate electrode 185 may be electrically connected to each other. That is, the active region of the substrate 100 and the gate electrode 185 may share the contact 260.

By performing above described processes, the semiconductor device having the shared contact 260 and the metal gate electrode 185 may be manufactured.

In the method of manufacturing the semiconductor device, the second etch stop layer 220 may not be directly formed on the second sacrificial layer 210. However, after removing the second sacrificial layer 210 and forming the second etch stop layer 220 covering a top surface of the gate structure 190, the insulating interlayer 240 and the opening 250 may be sequentially formed. Therefore, when forming the opening 250, the gate structure 190 and the spacer 140 may not be damaged because of the second etch stop layer 220 thereon even though the insulating interlayer 240 may have a step difference. Accordingly, when the shared contact 260 is formed, problems of a leakage current and increased resistivity may not occur.

FIGS. 13 through 19 are cross-sectional views illustrating a method of manufacturing a semiconductor device in accordance with another exemplary embodiment of the present general inventive concept. The semiconductor device may be a static random access memory (SRAM) device, and the method may include processes substantially the same as or similar to those illustrated with reference to FIGS. 1 through 12. Thus, detailed explanations thereon are omitted here.

Figure 13:
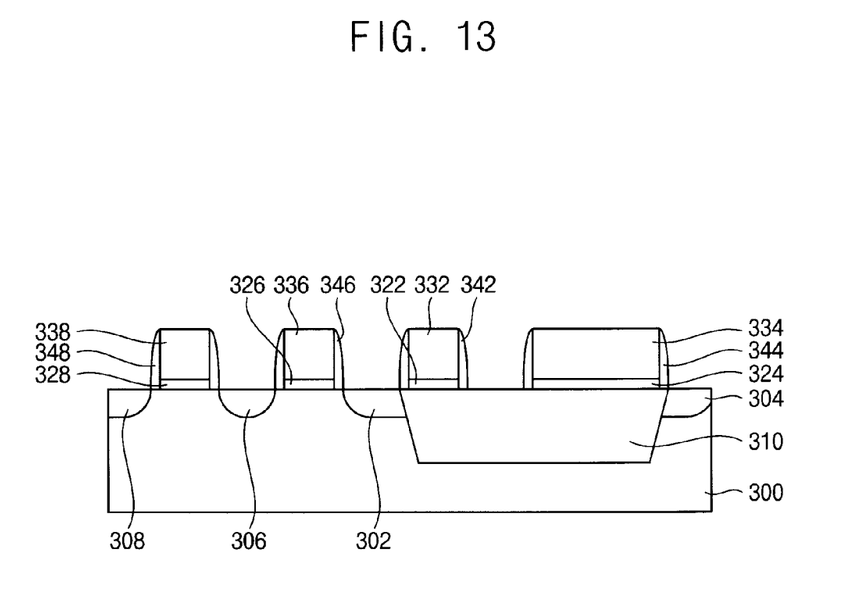
FIGS. 13 through 19 are cross-sectional views illustrating a method of manufacturing a semiconductor device in accordance with another exemplary embodiment of the present general inventive concept.

Referring to FIG. 13, first through fourth low-k dielectric layer patterns 322, 324, 326 and 328, first through fourth dummy gate electrodes 332, 334, 336 and 338, and first through fourth spacers 342, 344, 346 and 348 may be formed on a substrate 300 having an isolation layer 310 thereon. The substrate 300 may be doped using n-type low or light doping, such that the doping of the substrate 300 is performed at a magnitude of one dopant atom added per 100 million atoms. To correspond with the substrate 300, the isolation layer 310 may be formed using p-type doping. However, the substrate 300 and the isolation layer 310 are not limited to the aforementioned doping types.

Particularly, a low-k dielectric layer and a dummy gate electrode layer may be sequentially formed on the substrate 300 having the isolation layer 310 thereon. In example embodiments, the low-k dielectric layer may be formed by depositing silicon oxide (SiO2) on the substrate 300 and the isolation layer 310 through a CVD process. The dummy gate electrode layer may be formed by depositing polysilicon, amorphous silicon, etc. on the low-k dielectric layer through a CVD process.

By patterning the dummy gate electrode layer and the low-k dielectric layer through a photolithography process, the first low-k dielectric layer pattern 322 and the first dummy gate electrode 332, and the second low-k dielectric layer pattern 324 and the second dummy gate electrode 334 may be sequentially formed on the isolation layer 310. Additionally, the third low-k dielectric layer pattern 326 and the third dummy gate electrode 336, and the forth low-k dielectric layer pattern 328 and the fourth dummy gate electrode 338 may be sequentially formed on the substrate 300. In an example embodiment, the first and second low-k dielectric layer patterns 322 and 324 may extend along a direction, and the first and second dummy gate electrodes 332 and 334 may also extend along the direction. Portions of the first and second low-k dielectric layer patterns 322 and 324, and portions of the first and second dummy gate electrodes 332 and 334 may be formed directly on the substrate 300 where the isolation layer 310 is not formed, that is, on an active region of the substrate 300.

A spacer layer including silicon nitride or silicon oxide may be formed on the isolation layer 310 and the substrate 300 to cover the dummy gate electrodes 332, 334, 336 and 338 and the low-k dielectric layer patterns 322, 324, 326 and 328. The spacer layer may be patterned by an anisotropic etching process so that the first through fourth spacers 342, 344, 346 and 348 may be formed on sidewalls of the first to fourth dummy gate electrodes 332, 334, 336 and 338 and the first through fourth low-k dielectric layer patterns 322, 324, 326 and 328, respectively.

An ion implantation process using the dummy gate electrodes 332, 334, 336 and 338 and the spacers 342, 344, 346 and 348 as an ion implantation mask may be performed to form first through fourth impurity regions 302, 304, 306 and 308 at upper portions of the active region adjacent to the dummy gate electrodes 332, 334, 336 and 338, respectively. Particularly, the first impurity region 302 may be formed at an upper portion of the substrate 300 between the first and third dummy gate electrodes 332 and 336, the second impurity region 304 may be formed at an upper portion of the substrate 300 adjacent to the second dummy gate electrode 334, the third impurity region 306 may be formed at an upper portion of the substrate 300 between the third and fourth dummy gate electrodes 336 and 338, and the fourth impurity region 308 may be formed at an upper portion of the substrate 300 adjacent to the fourth dummy gate electrode 338. The first through fourth impurity regions 302, 304, 306 and 308 may be formed using n-type heavy or high doping, such that the first through fourth impurity regions 302, 304, 306 and 308 are formed by the doping process at a magnitude of one atom added per ten thousand atoms. Accordingly, a concentration of atoms in the first through fourth impurity regions 302, 304, 306 and 308 may be designated as "n+." However, the first through fourth impurity regions 302, 304, 306 and 308 are not limited to the aforementioned doping types.

Figure 14:
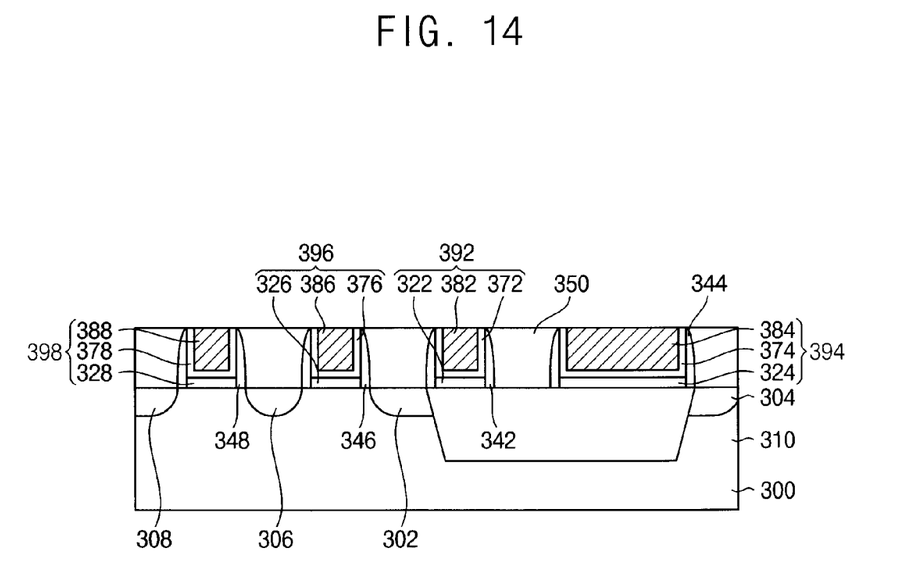

Referring to FIG. 14, processes substantially the same as or similar to those illustrated with reference to FIGS. 2 through 5 may be performed.

That is, a first sacrificial layer 350 may be formed on the substrate 300 and the isolation layer 310 to cover the dummy gate electrodes 332, 334, 336 and 338, and the spacers 342, 344, 346 and 348. An upper portion of the first sacrificial layer 350 may be planarized using top surfaces of the dummy gate electrodes 332, 334, 336 and 338 as a planarization endpoint. Exposed dummy gate electrodes 332, 334, 336 and 338 may be removed to form recesses (not illustrated). A high-k dielectric layer may be formed on inner walls of the recesses and a top surface of the first sacrificial layer 350, and a gate electrode layer may be formed on the high-k dielectric layer. Upper portions of the gate electrode layer and the high-k dielectric layer may be planarized using a top surface of the first sacrificial layer 350 as a planarization endpoint, so that first to fourth high-k dielectric layer patterns 372, 374, 376 and 378 may be formed on the inner walls of the recesses, respectively, and first to fourth gate electrodes 382, 384, 386 and 388 may be formed on the first to fourth high-k dielectric layer patterns 372, 374, 376 and 378, respectively, to fill remaining portions of the recesses.

A first gate structure 392 including the first low-k dielectric layer pattern 322, the first high-k dielectric layer pattern 372, and the first gate electrode 382 may be formed in a field region of the substrate 300. A second gate structure 394 including the second low-k dielectric layer pattern 324, the second high-k dielectric layer pattern 374, and the second gate electrode 384 may be also formed in the field region of the substrate 300. The first and second spacers 342 and 344 may be formed on sidewalls of the first and second gate structures 392 and 394, respectively. Additionally, a third gate structure 396 including the third low-k dielectric layer pattern 326, the third high-k dielectric layer pattern 376, and the third gate electrode 386 may be formed in an active region of the substrate 300. A fourth gate structure 398 including the fourth low-k dielectric layer pattern 328, the forth high-k dielectric layer pattern 378, and the fourth gate electrode 388 may be also formed in the active region of the substrate 300. The third and fourth spacers 346 and 348 may be formed on sidewalls of the third and fourth gate structures 396 and 398, respectively.

The low-k dielectric layer patterns 322, 324, 326 and 328, and the high-k dielectric layer patterns 372, 374, 376 and 378 may serve as gate insulation layer patterns. As described above, the first and second gate structures 392 and 394 may be formed in the field region of the substrate 300, while portions of the first and second gate structure 392 and 394 may be formed in the active region of the substrate 300.

In example embodiments, the gate structures 392, 394, 396 and 398, and the impurity regions 302, 304, 306 and 308 may serve as at least one of a drive transistor, a load transistor, and an access transistor of the static random access memory device.

Figure 15:
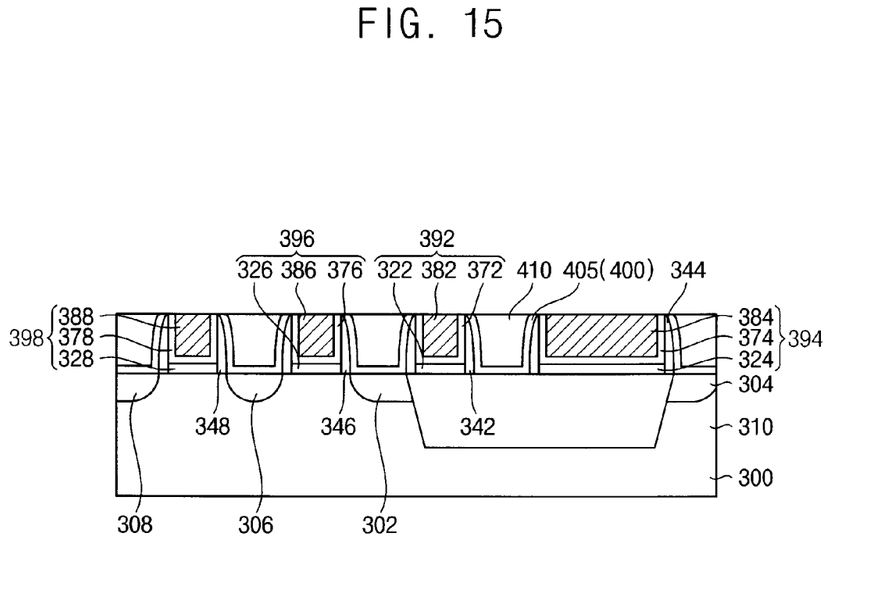

Referring to FIG. 15, processes substantially the same as or similar to those illustrated with reference to FIGS. 6 through 7 may be performed.

That is, the first sacrificial layer 350 may be removed, and a first etch stop layer 400 may be formed on the substrate 300 and the isolation layer 310 to cover the gate structures 392, 394, 396 and 398, and the spacers 342, 344, 346 and 348. The first etch stop layer 400 may be formed using a nitride, e.g., silicon nitride.

A second sacrificial layer 410 may be formed on the first etch stop layer 400, and upper portions of the second sacrificial layer 410 and the first etch stop layer 400 may be planarized using top surfaces of the gate structures 392, 394, 396 and 398 as a planarization endpoint. Therefore, the first etch stop layer 400 may be transformed into a first etch stop layer pattern 405.

Figure 16:
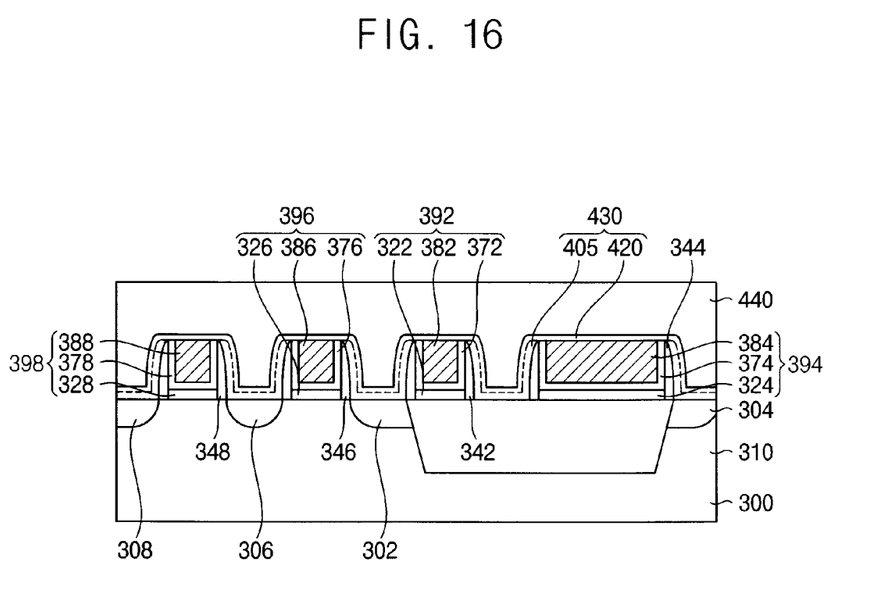

Referring to FIG. 16, processes substantially the same as or similar to those illustrated with reference to FIGS. 8 through 9 may be performed.

That is, after removing the second sacrificial layer 410, a second etch stop layer 420 may be formed on the gate structures 392, 394, 396 and 398, the spacers 342, 344, 346 and 348, and the first etch stop layer pattern 405. The second etch stop layer 420 may be formed using a nitride, e.g., silicon nitride, so that the second etch stop layer 420 and the first etch stop layer pattern 405 may be merged into a etch stop structure 430.

An insulating interlayer 440 may be formed on the etch stop structure 430.

Figure 17:
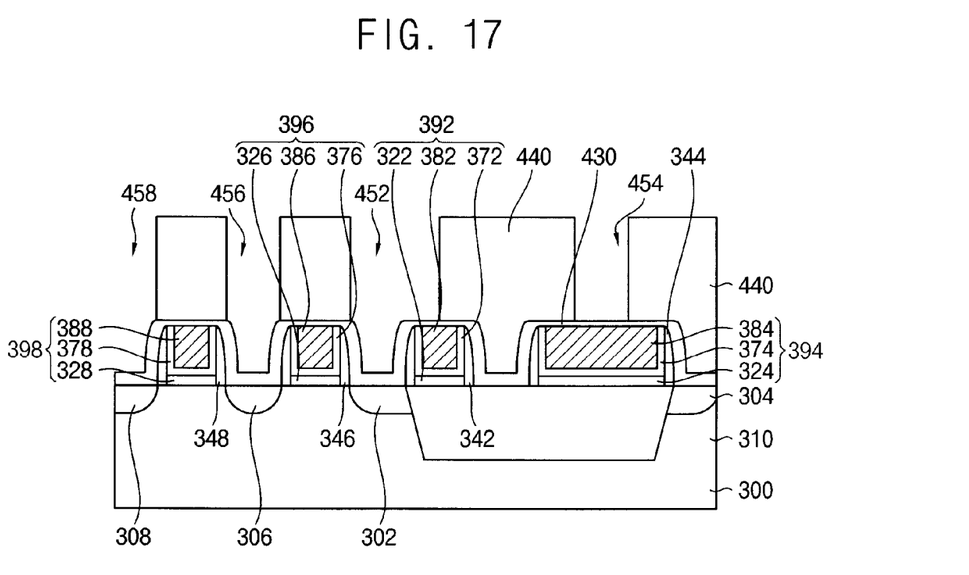

Referring to FIG. 17, processes substantially the same as or similar to those illustrated with reference to FIG. 10 may be performed.

That is, a portion of the insulation interlayer 440 may be etched to form first through fourth openings 452, 454, 456 and 458 exposing portions of the etch stop layer structures 430. In example embodiments, the first opening 452 may be formed through the insulating interlayer 440 to overlap a portion of the first gate electrode 382 and the first impurity region 302, the second opening 454 may be formed through the insulating interlayer 440 to overlap a portion of the second gate electrode 384, the third opening 456 may be formed through the insulating interlayer 440 to overlap the third impurity region 306, and the fourth opening 458 may be formed through the insulating interlayer 440 to overlap the fourth impurity region 308.

When forming the openings 425, 454, 456 and 458, the etch rate of the insulating interlayer 440 may be different from that of the etch stop layer structure 430. Therefore, the insulating interlayer 440 may be fully removed using the etch stop layer structure 430 as an etching endpoint even though the insulating interlayer 440 may have different thicknesses on the gate structures 392 and 394, and on the active region of the substrate 300.

Figure 18:
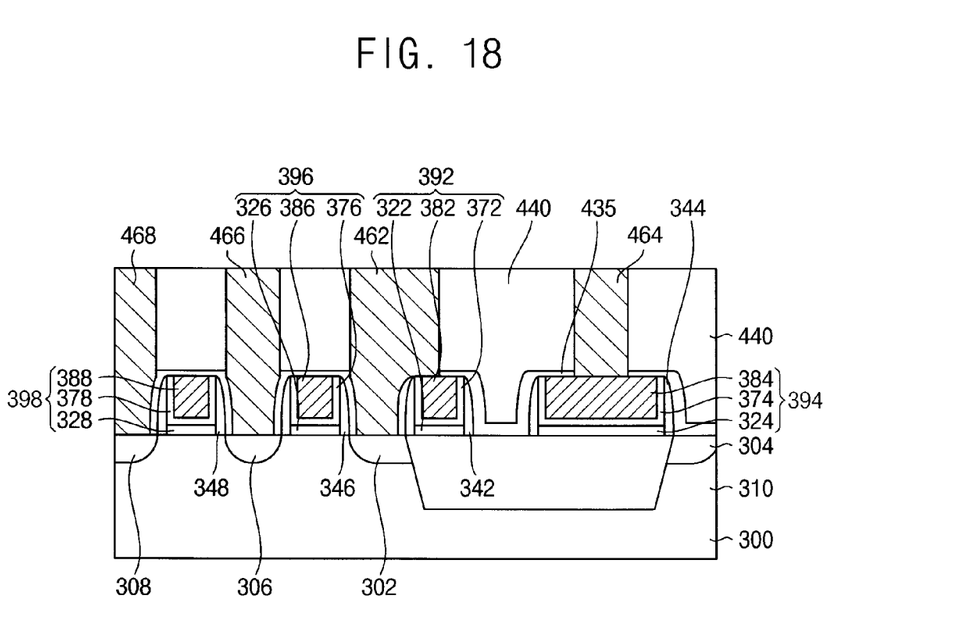

Referring to FIG. 18, processes substantially the same as or similar to those illustrated with reference to FIGS. 11 and 12 may be performed.

That is, the portions of the etch stop layer structure 430 exposed by the openings 452, 454, 456 and 458 may be removed. Therefore, portions of the first and second gate electrodes 382 and 384, a portion of the first high-k dielectric layer pattern 372, and portions of the first, third and fourth impurity regions may be exposed. A portion of the etch stop layer structure 430 may remain on sidewalls of the spacers 342, 344, 346 and 348, and may define an etch stop layer pattern structure 435 together with the portions of the etch stop layer structure 430 not exposed by the openings 452, 454, 456 and 458.

The etching process may be performed without damaging the gate structures 392, 394, 396 and 398 or the spacers 342, 344, 346 and 348.

First through fourth contacts 462, 464, 466 and 468 may be formed in the openings 452, 454, 456 and 458, respectively. The contacts 462, 464, 466 and 468 may be formed using doped polysilicon, a metal, a metal nitride, and/or a metal silicide, but are not limited thereto.

The first contact 462 may be formed to make contact with the first impurity region 302 of the substrate 300 and the first gate electrode 382, so that the first impurity region 302 and the first gate electrode 382 may share the first contact 462.

Figure 19:
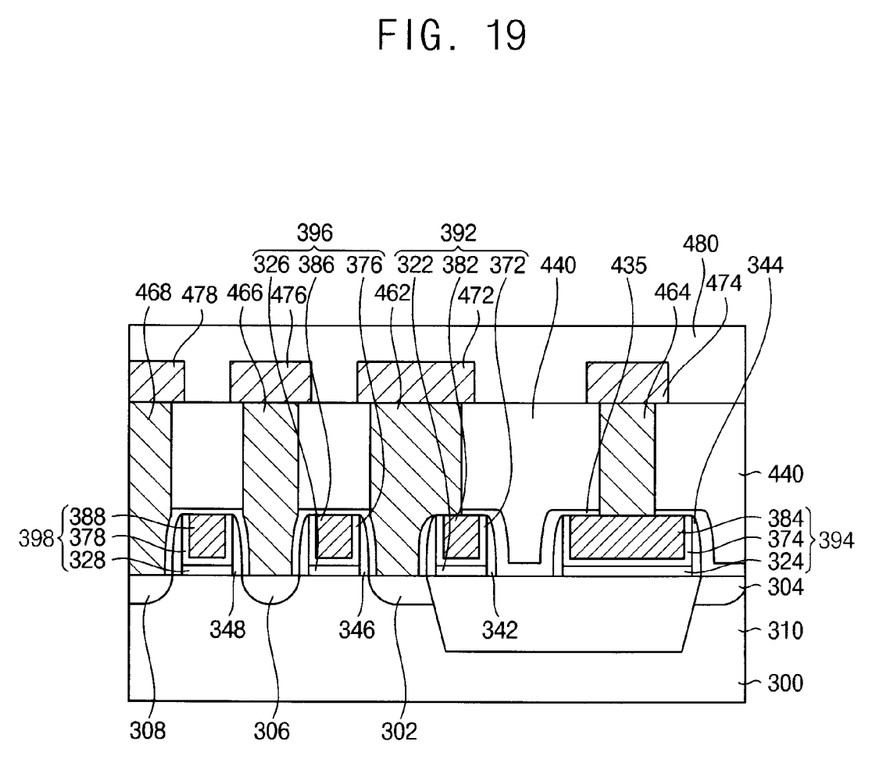

Referring to FIG. 19, first through fourth wirings 472, 474, 476 and 478 may be formed on the contacts 462, 464, 466 and 468, respectively, and on the insulating interlayer 440. A conductive layer may be formed on the contacts 462, 464, 466 and 468 and the insulating interlayer 440, and the conductive layer may be patterned to form the wirings 472, 474, 476 and 478. Therefore, the first through fourth wirings 472, 474, 476 and 478 may be formed to be electrically connected to the first to fourth contacts 462, 464, 466 and 468, respectively. The conductive layer may be formed using doped polysilicon, a metal, a metal nitride, and/or a metal silicide, but is not limited thereto.

A protection layer 480 covering the wirings 472, 474, 476 and 478 may be formed to manufacture the semiconductor device. Referring to FIG. 19, the second gate structure 394 may be used in a memory transistor and the first gate structure 392, the third gate structure 396, and the fourth gate structure 398 may be used in control transistors.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

According to example embodiments, after forming a gate structure by a damascene process and performing a planarization process, an etch stop layer may be formed to cover a top surface of the gate structure. Therefore, when forming an opening in an insulating interlayer covering the gate structure, a lower portion of the gate structure and a spacer on a sidewall of the gate structure may not be damaged in spite of a step difference in the insulating interlayer. Accordingly, when a shared contact is formed in the opening, problems of leakage current or increased resistivity may not occur.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing a semiconductor device, comprising:
    forming a second sacrificial layer on a substrate, the second sacrificial layer containing a gate structure and a spacer therethrough, the spacer being on a sidewall of the gate structure;
    removing the second sacrificial layer;
    forming a second etch stop layer and an insulating interlayer sequentially on the gate structure, the spacer and the substrate;
    forming an opening through the insulating interlayer to expose a portion of the second etch stop layer on portions of the gate structure, the spacer and the substrate;
    removing the exposed portion of the second etch stop layer to expose the portions of the gate structure, the spacer and the substrate; and
    forming a contact electrically connected to the gate structure and the substrate, the contact filling the opening.

2. The method of claim 1, wherein the second etch stop layer is formed using silicon nitride and the insulating interlayer is formed using silicon oxide.

3. The method of claim 1, wherein the gate structure includes a gate insulation layer pattern and a gate electrode having a metal.

4. The method of claim 3, wherein the exposed portion of the gate structure is a portion of the gate electrode.

5. The method of claim 3, wherein the gate insulation layer pattern includes a low-k dielectric layer pattern and a high-k dielectric layer pattern.

6. The method of claim 5, wherein the low-k dielectric layer pattern is formed on the substrate using silicon oxide, and the high-k dielectric layer pattern is formed on the low-k dielectric layer pattern using a metal oxide to surround a bottom and a sidewall of the gate electrode.

7. The method of claim 1, wherein forming the second sacrificial layer containing the gate structure and the spacer therethrough includes:
    forming a first sacrificial layer on the substrate, the first sacrificial layer containing a dummy gate electrode and a spacer therethrough, the spacer being on a sidewall of the dummy gate electrode;
    removing the dummy gate electrode to form a recess;

forming a gate electrode using a metal, the gate electrode filling the recess;
removing the first sacrificial layer;
forming a first etch stop layer and the second sacrificial layer sequentially on the gate electrode, the spacer and the substrate; and
planarizing upper portions of the second sacrificial layer and the first etch stop layer using a top surface of the gate electrode as a planarization endpoint.

8. The method of claim 7, wherein the dummy gate electrode is formed using amorphous silicon or polysilicon.

9. The method of claim 7, prior to forming the first sacrificial layer containing the dummy gate electrode and the spacer therethrough, forming the second sacrificial layer containing the gate structure and the spacer therethrough further includes forming a low-k dielectric layer pattern on the substrate,
wherein the spacer is formed on sidewalls of the dummy gate electrode and the low-k dielectric layer pattern.

10. The method of claim 7, forming the gate electrode includes:
forming a high-k dielectric layer on an inner wall of the recess and the first sacrificial layer;
forming a gate electrode layer filling a remaining portion of the recess on the high-k dielectric layer; and
planarizing upper portions of the gate electrode layer and the high-k dielectric layer using a top surface of the first sacrificial layer as a planarization endpoint.

11. A method of manufacturing a semiconductor device, comprising:
forming a second sacrificial layer on a substrate having an isolation layer thereon, the second sacrificial layer containing a first gate structure, a second gate structure, a first spacer, and a second spacer therethrough, and the first and second spacers being on sidewalls of the first and second gate structures, respectively;
removing the second sacrificial layer;
forming a second etch stop layer and an insulating interlayer sequentially on the first and second gate structures, the first and second spacers, the isolation layer, and the substrate;
forming an opening through the insulating interlayer to expose a portion of the second etch stop layer on portions of the first gate structure, the first spacer and the substrate;
removing the exposed portion of the second etch stop layer to expose the portions of the first gate structure, the first spacer and the substrate; and
forming a contact electrically connected to the first gate structure and the substrate, the contact filling the opening.

12. The method of claim 11, wherein the first gate structure and the first spacer are formed on the isolation layer.

13. The method of claim 11, further comprising forming an impurity region at an upper portion of the substrate adjacent to the second gate structure.

14. The method of claim 13, wherein the contact is electrically connected to the impurity region.

15. The method of claim 11, wherein the second etch stop layer is formed using silicon nitride, and the insulating interlayer is formed using silicon oxide.

* * * * *

UNITED STATES PATENT AND TRADEMARK OFFICE
CERTIFICATE OF CORRECTION

PATENT NO. : 8,927,355 B2  
APPLICATION NO. : 13/304936  
DATED : January 6, 2015  
INVENTOR(S) : Doo-Young Lee et al.

Page 1 of 1

It is certified that error appears in the above-identified patent and that said Letters Patent is hereby corrected as shown below:

On the title page item (75), should read Doo-Young Lee, Seoul (KR); Ki Il Kim, Yongin-si (KR); Myeong-Cheol Kim, Suwon-si (KR); Do-Hyoung Kim, Hwaseong-si (KR); Do-Haing Lee, Hwaseong-si (KR)

Signed and Sealed this  
Fifth Day of May, 2015

Michelle K. Lee  
*Director of the United States Patent and Trademark Office*